(12) United States Patent
Aderhold et al.

(10) Patent No.: US 11,492,698 B2
(45) Date of Patent: Nov. 8, 2022

(54) OPTICALLY TRANSPARENT PEDESTAL FOR FLUIDLY SUPPORTING A SUBSTRATE

(71) Applicant: Applied Materials, Inc., Santa Clara, CA (US)

(72) Inventors: Wolfgang R. Aderhold, Cupertino, CA (US); Abhilash J. Mayur, Salinas, CA (US)

(73) Assignee: Applied Materials, Inc., Santa Clara, CA (US)

( * ) Notice: Subject to any disclaimer, the term of this patent is extended or adjusted under 35 U.S.C. 154(b) by 624 days.

(21) Appl. No.: 16/519,845

(22) Filed: Jul. 23, 2019

(65) Prior Publication Data

US 2020/0032386 A1 Jan. 30, 2020

Related U.S. Application Data

(60) Provisional application No. 62/702,580, filed on Jul. 24, 2018.

(51) Int. Cl.
| | |
|---|---|
| *C23C 14/50* | (2006.01) |
| *C23C 14/48* | (2006.01) |
| *H01L 21/67* | (2006.01) |
| *H01L 21/687* | (2006.01) |
| *H01J 37/32* | (2006.01) |

(52) U.S. Cl.
CPC .............. *C23C 14/50* (2013.01); *C23C 14/48* (2013.01); *H01L 21/67115* (2013.01); *H01L 21/68742* (2013.01); *H01L 21/68785* (2013.01); *H01L 21/68792* (2013.01); *H01J 37/3244* (2013.01)

(58) Field of Classification Search
CPC ........... H01J 37/3244; C23C 16/45565; C23C 14/50; C23C 14/48; H01L 21/67115
See application file for complete search history.

(56) References Cited

U.S. PATENT DOCUMENTS

| | | | |
|---|---|---|---|
| 5,156,820 A | 10/1992 | Wong et al. | |
| 5,753,891 A * | 5/1998 | Iwata | ................ H01L 21/67109 219/390 |
| 3,057,602 A1 | 11/2011 | Koelmel et al. | |
| 10,410,906 B2 * | 9/2019 | Wang | ................ H01L 21/67259 |
| 10,801,106 B2 * | 10/2020 | Yamada | ................ B05B 16/60 |
| 11,053,590 B2 * | 7/2021 | Mishra | ................ H01J 37/3244 |
| 2002/0011216 A1 | 1/2002 | Nguyen | |

(Continued)

OTHER PUBLICATIONS

International Search Report and Written Opinion for Application No. PCT/US2019042868 dated Nov. 6, 2019.

(Continued)

*Primary Examiner* — Mahdi H Nejad
(74) *Attorney, Agent, or Firm* — Patterson + Sheridan, LLP

(57) ABSTRACT

A pedestal for a thermal treatment chamber is disclosed that includes a body consisting of an optically transparent material. The body includes a first plate with a perforated surface having a plurality of nozzles formed therein, a first portion of the plurality nozzles formed in the body at an angle that is orthogonal to a plane of the first plate, a second portion of the plurality of nozzles formed in the body in an azimuthal orientation and at an acute angle relative to the plane of the first plate, and a third portion of the plurality nozzles formed in the body in a radial orientation and at an acute angle relative to the plane of the first plate.

18 Claims, 4 Drawing Sheets

(56) References Cited

U.S. PATENT DOCUMENTS

| | | | |
|---|---|---|---|
| 2004/0003777 A1* | 1/2004 | Carpenter | C23C 16/45544 |
| | | | 427/248.1 |
| 2005/0229854 A1 | 10/2005 | Moroz | |
| 2008/0280453 A1* | 11/2008 | Koelmel | H01L 21/6838 |
| | | | 438/758 |
| 2009/0095731 A1 | 4/2009 | Asakura et al. | |
| 2014/0096716 A1 | 4/2014 | Chung et al. | |
| 2016/0118280 A1 | 4/2016 | Wood et al. | |
| 2018/0114690 A1* | 4/2018 | Nishikawa | H01J 37/00 |
| 2019/0145002 A1* | 5/2019 | Um | C23C 16/4585 |
| | | | 118/722 |
| 2019/0157129 A1* | 5/2019 | Su | B65G 61/00 |
| 2019/0267217 A1* | 8/2019 | Nagaiwa | H01J 37/32715 |

OTHER PUBLICATIONS

Australian Examination Report for Application No. AU 2018205516 dated Dec. 3, 2019.

* cited by examiner

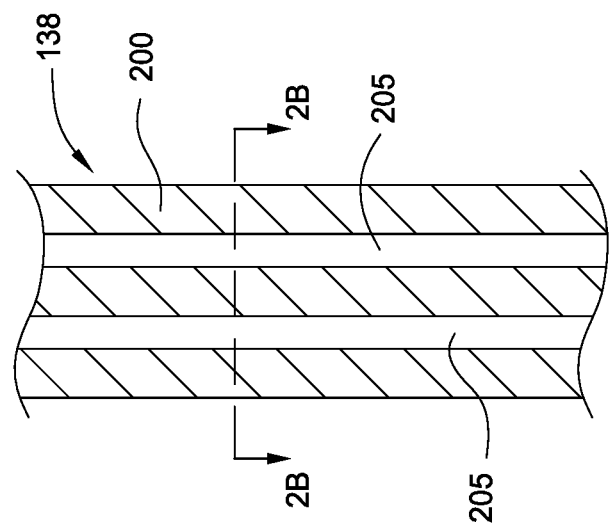
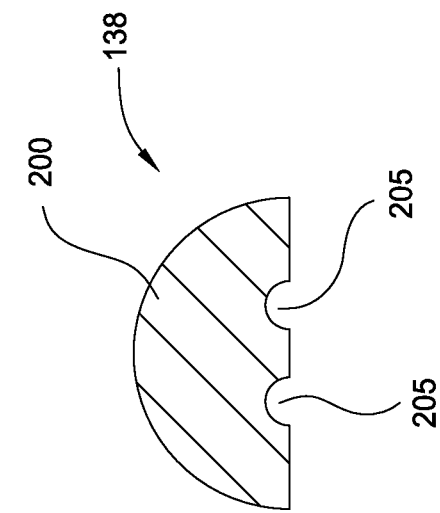
FIG. 2A
FIG. 2B

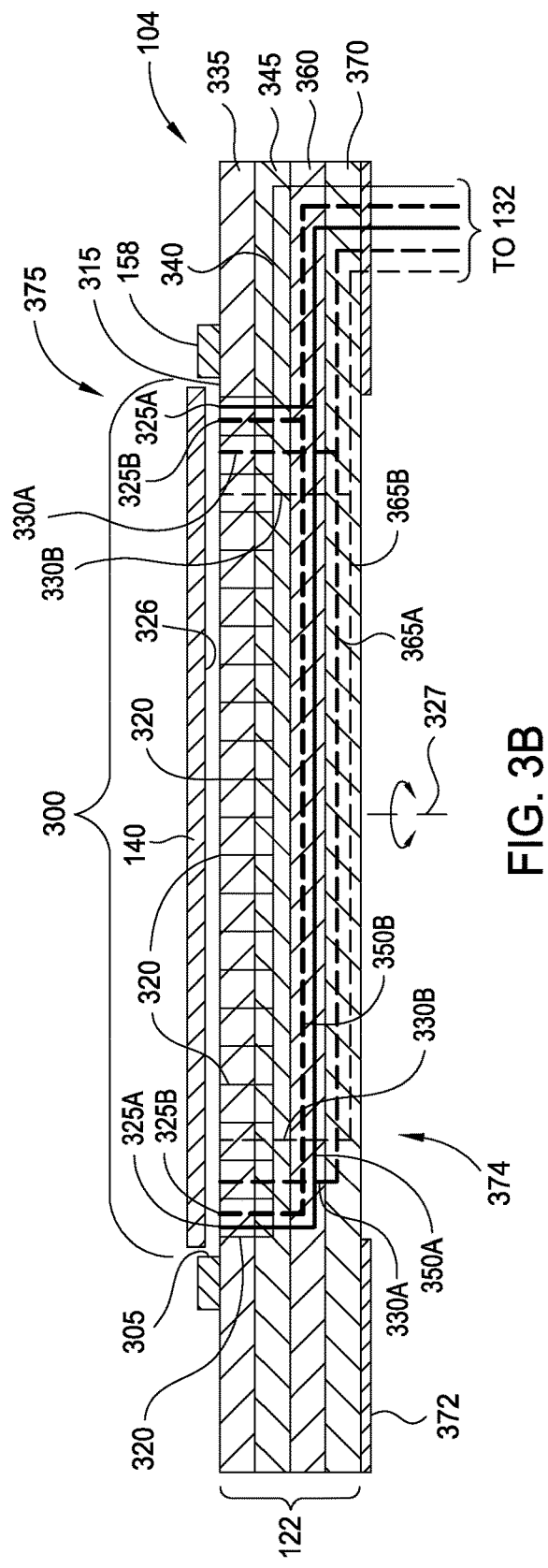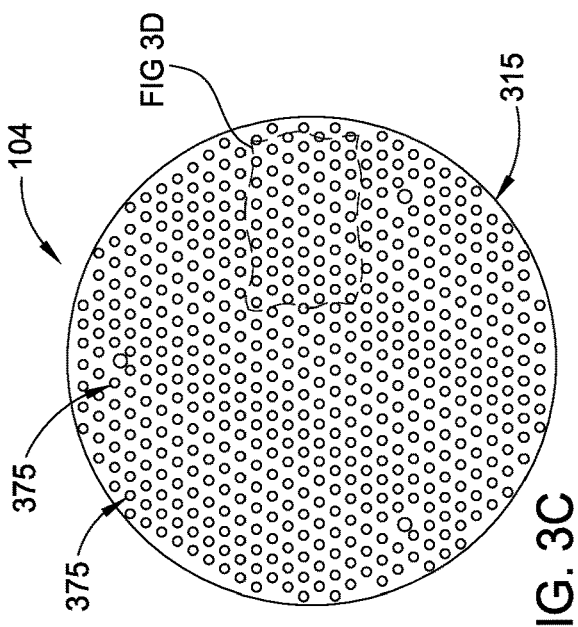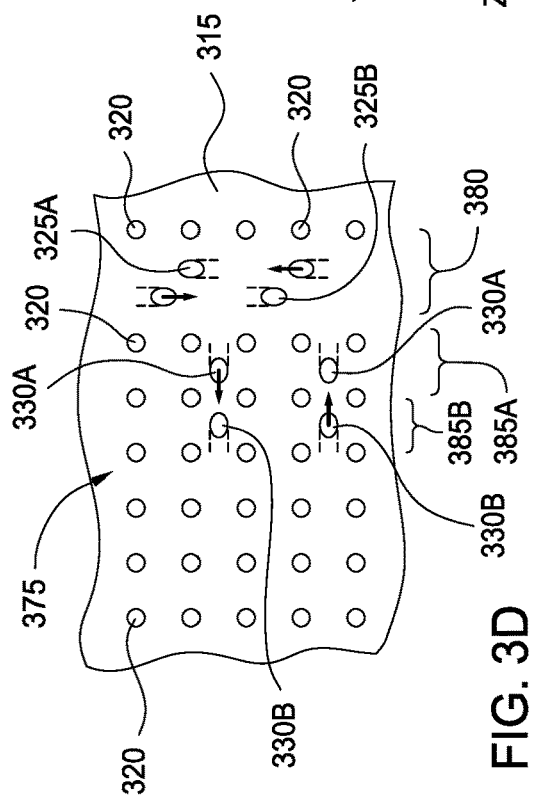
FIG. 3B
FIG. 3C
FIG. 3D

OPTICALLY TRANSPARENT PEDESTAL FOR FLUIDLY SUPPORTING A SUBSTRATE

CROSS-REFERENCE TO RELATED APPLICATION

This application claims benefit of U.S. Provisional Patent Application Ser. No. 62/702,580, filed Jul. 24, 2018, which is incorporated by reference herein.

BACKGROUND

Field

Embodiments of the present disclosure generally relate to a method and apparatus for processing semiconductor substrates. More specifically, embodiments of the present disclosure generally relate to methods and apparatus for thermally treating semiconductor substrates.

Description of the Related Art

Integrated circuits have evolved into complex devices that can include millions of transistors, capacitors, and resistors on a single chip. The evolution of chip design continually requires faster circuitry and greater circuit density that demand increasingly precise fabrication processes. One fabrication process frequently used is ion implantation.

Ion implantation is utilized in forming transistor structures on a film deposited on a semiconductor substrate to change the electrical properties of the film. During ion implantation, the implanted film may develop a high level of internal stress. In order to relieve the stress and further control the resulting properties of the implanted film, the film is typically subjected to a thermal process, such as annealing. Post-ion implantation annealing is typically performed in a rapid thermal processing (RTP) chamber that subjects the substrate to a very brief, yet highly controlled thermal cycle that can heat the substrate from room temperature to approximately 450° C. to about 1400° C. RTP typically minimizes or relieves the stress induced during implantation and can be used to further modify film properties, such as changing the electrical characteristics of the film by controlling dopant diffusion.

The RTP heating regime generally includes heating from a radiant heat source, such as lamps and/or resistive heating elements. In a conventional RTP system, the substrate is heated on a susceptor to a desired temperature, and then the radiant heat source is turned off, which causes the substrate to cool. However, as processing parameters continue to evolve, temperature ramp up and heating uniformity during RTP, and monitoring and control thereof, have more of an effect on process uniformity. While conventional RTP chambers rely on the radiant heat source to rapidly heat the substrate to a desired temperature, the challenges arise when the substrate cooling affects heating uniformity, and/or when the substrate is rapidly cooled. For example, if a significant temperature gradient exists across the substrate, the substrate may plastically deform or warp, which may be detrimental to subsequent processes performed on the substrate. Further, the slower cooling and/or reduced temperature control of the substrate may result in reduced throughput and/or reduced dopant uniformity.

Therefore, what is needed is an apparatus and method for rapid heating and cooling of a semiconductor substrate, with enhanced control of heat uniformity.

SUMMARY

A pedestal for a thermal treatment chamber is disclosed that includes a body consisting of an optically transparent material in one embodiment. The body includes a first plate with a perforated surface having a plurality of nozzles formed therein, a first portion of the plurality nozzles formed in the body at an angle that is orthogonal to a plane of the first plate, a second portion of the plurality of nozzles formed in the body in an azimuthal orientation and at an acute angle relative to the plane of the first plate, and a third portion of the plurality nozzles formed in the body in a radial orientation and at an acute angle relative to the plane of the first plate.

In another embodiment, a pedestal for a thermal treatment chamber is disclosed that includes a body consisting of an optically transparent material. The body includes a first plate with a perforated surface having a plurality of nozzles formed therein, a first portion of the plurality nozzles formed in the body at an angle that is orthogonal to a plane of the first plate, a second portion of the plurality of nozzles formed in the body in an azimuthal orientation and at an acute angle relative to the plane of the first plate, and a third portion of the plurality nozzles formed in the body in a radial orientation and at an acute angle relative to the plane of the first plate, and a second plate coupled to the first plate, the second plate including a first plurality of radially oriented channels that are in fluid communication with a portion the plurality of nozzles formed in the first plate.

In another embodiment, a pedestal for a thermal treatment chamber is disclosed that includes a body consisting of an optically transparent material. The body includes a first plate with a perforated surface having a plurality of nozzles formed therein in concentric circles, a first portion of the plurality nozzles formed in the body at an angle that is orthogonal to a plane of the first plate, a second portion of the plurality of nozzles formed in the body in an azimuthal orientation and at an acute angle relative to the plane of the first plate, and a third portion of the plurality nozzles formed in the body in a radial orientation and at an acute angle relative to the plane of the first plate, and a second plate coupled to the first plate, the second plate including a first plurality of radially oriented channels that are in fluid communication with a portion the plurality of nozzles formed in the first plate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 2A is an enlarged sectional view of one of the lift pins shown in FIG. 1.

FIG. 2B is a top view of the lift pin along lines 2B-2B of FIG. 2A.

FIG. 3B is a sectional view of the pedestal and the edge ring along lines 3B-3B of FIG. 3A.

FIG. 3C is a schematic plan view of the pedestal showing one embodiment of a perforated surface.

FIG. 3D is an enlarged view of a portion of the perforated surface of the pedestal of FIG. 3C.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
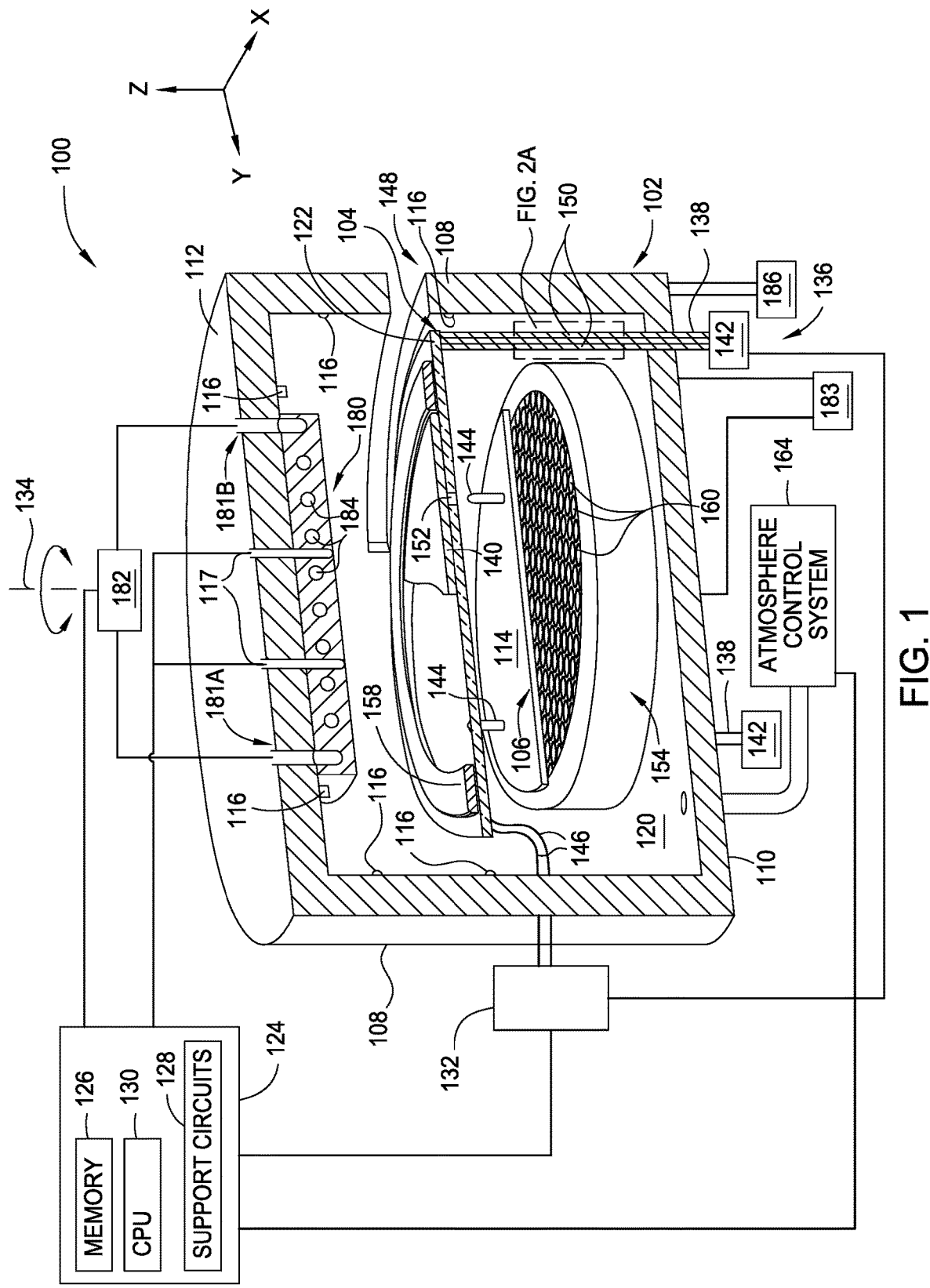
FIG. 1 is a simplified isometric view of one embodiment of a rapid thermal processing (RTP) chamber.

FIG. 1 is a simplified isometric view of one embodiment of a rapid thermal processing chamber 100. Examples of rapid thermal processing chambers that may be adapted to benefit from the disclosure are Quantum® X plus and CENTURA® thermal processing systems, both available from Applied Materials, Inc., located in Santa Clara, Calif. Although the apparatus is described as utilized within a rapid thermal processing chamber, embodiments described herein may be utilized in other processing systems and devices where at least two temperature zones within one processing region is desired, such as substrate support platforms adapted for robot handoffs, orientation devices, deposition chambers, etch chambers, electrochemical processing apparatuses and chemical mechanical polishing devices, among others, particularly where the minimization of particulate generation is desired. Embodiments of the disclosure may also be utilized in processing systems available from other manufacturers.

The processing chamber 100 includes pedestal 104 disposed in a chamber body 102. The chamber body 102 has walls 108, a bottom 110, and a top 112 defining an interior volume 120. The walls 108 typically include at least one substrate access port 148 to facilitate entry and egress of a substrate 140 (a portion of which is shown in FIG. 1). The access port 148 may be coupled to a transfer chamber (not shown) or a load lock chamber (not shown) and may be selectively sealed with a valve, such as a slit valve (not shown). In one embodiment, the pedestal 104 is annular and the chamber 100 includes a radiant heat source 106 disposed in an inside diameter of the pedestal 104.

The pedestal 104 is a monolith consisting of an optically transparent body 122. The pedestal 104 is rotationally fixed relative to a longitudinal axis 134 of the chamber body 102 but is capable of raising and lowering vertically along the longitudinal axis 134 during processing, for example in the Z direction. The pedestal 104 may also be raised or lowered in the Z direction before, during, or after processing. The pedestal 104 is adapted to support the substrate 140 using pressurized fluids from a fluid supply 132 such that no contact between the pedestal 104 and the substrate 140 occurs. The pressurized fluid from the fluid supply 132 is a gas, such as nitrogen, helium, argon, krypton, neon, hydrogen, clean dry air, or combinations thereof. Using the pressurized fluids, the pedestal 104 is also adapted to rotate the substrate 140 about the longitudinal axis 134 before, during, or after processing. Using the pressurized fluids, the pedestal 104 is also adapted to move the substrate 140 laterally relative to the longitudinal axis 134 (i.e., in an X-Y plane). Operation of the fluid bearing capabilities of the pedestal 104 will be described in more detail below.

The pedestal 104 is coupled to a lift mechanism 136 adapted to lift and lower the pedestal 104 relative to the chamber body 102. The lift mechanism 136 includes a plurality of lift pins 138 each of which are coupled to one or more lift motors 142 (only two are shown in this view). The lift motors 142 and portions of the lift pins 138 are shown positioned outside of the interior volume 120 and may be housed in a bellows (not shown). In one embodiment, each of the lift motors 142 include a stepper or servo motor, and is coupled to a respective lift pin 138 by a lead screw 132 to provide controllable rotation in response to a signal by the controller 124. Alternatively, other types of actuators may be utilized to control the linear movement of the lift pins 138, such as pneumatic cylinders, hydraulic cylinders, ball screws, solenoids, linear actuators and cam followers, among others.

The pressurized fluid from the fluid supply 132 is provided to the pedestal 104 using a flexible hose or flexible conduits 146, such as a flexible metal hose or flexible metal tubing, in one embodiment. The flexible conduits 146 allow for movement of the pedestal 104 in the Z direction within the interior volume 120. In another embodiment, the pressurized fluid from the fluid supply 132 is provided to the pedestal 104 using conduits 150 provided on or in the lift pins 138.

The processing chamber 100 also includes a window 114 made from a material transparent to heat and light of various wavelengths, which may include light in the infra-red (IR) spectrum, through which photons from the radiant heat source 106 may heat the substrate 140. In one embodiment, the window 114 is made of a quartz material, although other materials that are transparent to light may be used, such as sapphire. The window 114 includes a plurality of substrate support pins 144 coupled to an upper surface of the window 114. Each of the plurality of substrate support pins 144 are adapted to pass through lift pin openings 152 formed in the pedestal 104 when the pedestal 104 is lowered toward the window 114. When the pedestal 104 is lowered, each of the substrate support pins 144 selectively contact and support the substrate 140, to facilitate transfer of the substrate into and out of the chamber 100. Each of the plurality of substrate support pins 144 are configured to minimize absorption of energy from the radiant heat source 106 and may be made from the same material used for the window 114, and/or the pedestal 104, such as a quartz material. The plurality of substrate support pins 144 may be positioned and radially spaced from each other to facilitate passage of an end effector coupled to a transfer robot (not shown). Alternatively, the end effector and/or robot may be capable of horizontal and vertical movement to facilitate transfer of the substrate 140.

The radiant heat source 106 includes a lamp assembly 154 formed from a housing which includes a plurality of honeycomb tubes 160 coupled to a coolant source 183. The coolant source 183 may be one or a combination of water, ethylene glycol, nitrogen ($N_2$), and helium (He). Each tube 160 contains a reflector and a high-intensity lamp assembly or an IR emitter from which is formed a honeycomb-like pipe arrangement. This close-packed hexagonal arrangement of honeycomb tubes 160 provides radiant energy sources with high-power density and good spatial resolution. In one embodiment, the radiant heat source 106 provides sufficient radiant energy to thermally process the substrate 140, for example, annealing a silicon layer disposed on the substrate 140. The radiant heat source 106 may further include annular zones, wherein the voltage supplied to the plurality of tubes 160 by a controller 124 may varied to enhance the radial distribution of energy from the tubes 160. Dynamic control of the heating of the substrate 140 may be affected by the one or more temperature sensors 117 adapted to measure the temperature across the substrate 140. The optically transparent body 122 of the pedestal 104 is a material that is generally optically transparent to the direct radiations from the lamp assembly 154 without significant absorption. Thus, thermal energy from the lamp assembly 154 is transferred directly to the substrate 140 through the optically transparent body 122 of the pedestal 104 as well as the optically transparent material of the plurality of substrate support pins 144.

The controller 124 generally includes a central processing unit (CPU) 130, support circuits 128 and memory 126. The CPU 130 may be one of any form of computer processor that can be used in an industrial setting for controlling various actions and sub-processors. The memory 126, or computer-readable medium, may be one or more of readily available memory such as random access memory (RAM), read only memory (ROM), floppy disk, hard disk, or any other form of digital storage, local or remote, and is typically coupled to the CPU 130. The support circuits 128 are coupled to the CPU 130 for supporting the controller 124 in a conventional manner. These circuits include cache, power supplies, clock circuits, input/output circuitry, subsystems, and the like.

An atmosphere control system 164 is also coupled to the interior volume 120 of the chamber body 102. The atmosphere control system 164 generally includes throttle valves and vacuum pumps for controlling chamber pressure. The atmosphere control system 164 may additionally include gas sources for providing process or other gases to the interior volume 120. The atmosphere control system 164 may also be adapted to deliver process gases for thermal deposition processes.

The chamber 100 also includes one or more sensors 116, which are generally adapted to detect the position of the substrate 140 within the interior volume 120 of the chamber body 102. The sensors 116 may be coupled to the chamber body 102 and/or other portions of the processing chamber 100 and are adapted to provide an output indicative of the distance between the substrate 140 and the top 112 and/or bottom 110 of the chamber body 102, and may also detect misalignment of the substrate 140 relative to the longitudinal axis 134.

The one or more sensors 116 are coupled to the controller 124 that receives the output metric from the sensors 116 and provides a signal or signals to the one or more lift motors 142 to raise or lower at least a portion of the pedestal 104. The controller 124 is also coupled to the fluid supply 132 in order to control fluid flow to the pedestal 104 in order to control the position of the substrate 140 relative to the pedestal 104. For example, the fluid supply 132 may be utilized to elevate the substrate 140 relative to a surface of the pedestal 104, rotate the substrate 140 relative to the pedestal 104, and/or move the substrate 140 laterally relative to the pedestal 104. All of the movement provided by the fluid supply 132 is controlled by the controller 124 based on positional metrics provided by the sensors 116 and/or an annealing process recipe.

Each of the one or more sensors 116 may be a camera, an ultrasonic sensor, a laser sensor, an inductive sensor, a capacitive sensor, or other type of sensor or device capable of detecting the proximity of the substrate 140 relative to the pedestal 104. The sensors 116 may be coupled to the chamber body 102 proximate the top 112 or coupled to the walls 108, although other locations within and around the chamber body 102 may be suitable The chamber 100 also includes one or more temperature sensors 117, which may be adapted to sense temperature of the substrate 140 before, during, and after processing. In the embodiment depicted in FIG. 1, the temperature sensors 117 are disposed through the top 112, although other locations within and around the chamber body 102 may be used. The temperature sensors 117 may be optical pyrometers, as an example, pyrometers having fiber optic probes. The sensors 117 may be adapted to couple to the top 112 in a configuration to sense the entire diameter of the substrate, or a portion of the substrate 140. The sensors 117 may include a pattern defining a sensing area substantially equal to the diameter of the substrate, or a sensing area substantially equal to the radius of the substrate. For example, a plurality of sensors 117 may be coupled to the top 112 in a radial or linear configuration to enable a sensing area across the radius or diameter of the substrate 140. In one embodiment (not shown), a plurality of sensors 117 may be disposed in a line extending radially from about the center of the top 112 to a peripheral portion of the top 112. In this manner, the radius of the substrate 140 may be monitored by the sensors 117, which will enable sensing of the diameter of the substrate during rotation.

The chamber 100 also includes a cooling block 180 adjacent to, coupled to, or formed in the top 112. Generally, the cooling block 180 is spaced apart and opposing the radiant heat source 106. The cooling block 180 includes one or more coolant channels 184 coupled to an inlet 181A and an outlet 181B. The cooling block 180 may be made of a process resistant material, such as stainless steel, aluminum, a polymer, or a ceramic material. The coolant channels 184 may include a spiral pattern, a rectangular pattern, a circular pattern, or combinations thereof and the channels 184 may be formed integrally within the cooling block 180, for example by casting the cooling block 180 and/or fabricating the cooling block 180 from two or more pieces and joining the pieces. Additionally or alternatively, the coolant channels 184 may be drilled into the cooling block 180. The inlet 181A and outlet 181B may be coupled to a coolant source 182 by valves and suitable plumbing and the coolant source 182 is in communication with the controller 124 to facilitate control of pressure and/or flow of a fluid disposed therein. The fluid may be water, ethylene glycol, nitrogen ($N_2$), helium (He), or other fluid used as a heat exchange medium.

The cooling block 180 may be formed from a material such as aluminum, stainless steel, nickel, a ceramic, or a process resistant polymer. The cooling block 180 may comprise a reflective material, or include a reflective coating configured to reflect heat onto the substrate surface. Alternatively, the cooling block 180 may comprise a black material (such as a black material configured to absorb energy substantially similar to a black body) or otherwise coated or finished with a black material or surface that is configured to absorb heat from the substrate 140 and/or the interior volume 120. The cooling block 180 may also include a face or outer surface facing the substrate 140 that may be roughened or polished to promote reflectivity or absorption of radiant energy in the form of heat and/or light. The outer surface may also include a coating or finish to promote reflectivity or absorption, depending on the process parameters. In one embodiment, the cooling block 180 may be a black material or a material resembling a black material, or otherwise coated or finished with a black material or resembling a black material, to have an emissivity or emittance near 1, such as an emissivity between about 0.70 to about 0.95.

As described herein, the chamber 100 is adapted to receive a substrate 140 in a "face-up" orientation, wherein the deposit-receiving side or face of the substrate 140 is oriented toward the cooling block 180 and the "backside" of the substrate 140 is facing the radiant heat source 106. The "face-up" orientation may allow the energy from the radiant heat source 106 to be absorbed more rapidly by the substrate 140 as the backside of the substrate 140 is typically less reflective than the face of the substrate 140.

An edge ring 158 is also shown on the pedestal 104. The edge ring 158 may be fixed to the pedestal 104 in a manner that the edge ring 158 does not make contact with the pedestal 104. The edge ring 158 may be made of the same material as the substrate 140 in order to extend the thermal load of the substrate 140. For example, the edge ring 158 may be made of silicon carbide coated with a silicon film to mimic the absorptivity of a silicon film on the substrate 140. The edge ring 158 may be utilized to minimize or eliminate temperature deltas within the substrate 140 during processing.

FIG. 2A is an enlarged sectional view of one of the lift pins 138 shown in FIG. 1 and FIG. 2B is a top view of the lift pin 138 along lines 2B-2B of FIG. 2A. The lift pin 138 includes a body 200 made of a metallic material or a ceramic material. The body 200 includes one or more internal conduits 205 that may be utilized to flow fluids from the fluid supply 132 to the pedestal 104. The internal conduits 205 may be in fluid communication with the fluid supply 132 at an end of the lift pin 138 adjacent to a respective lift motor 142 (shown in FIG. 1). The connection of the internal conduits 205 with the fluid supply 132 is configured to allow movement of the lift pin 138. For example, the internal conduits 205 may be coupled to the fluid supply 132 using flexible hoses or flexible tubing positioned outside of the interior volume 120.

Figure 3A:
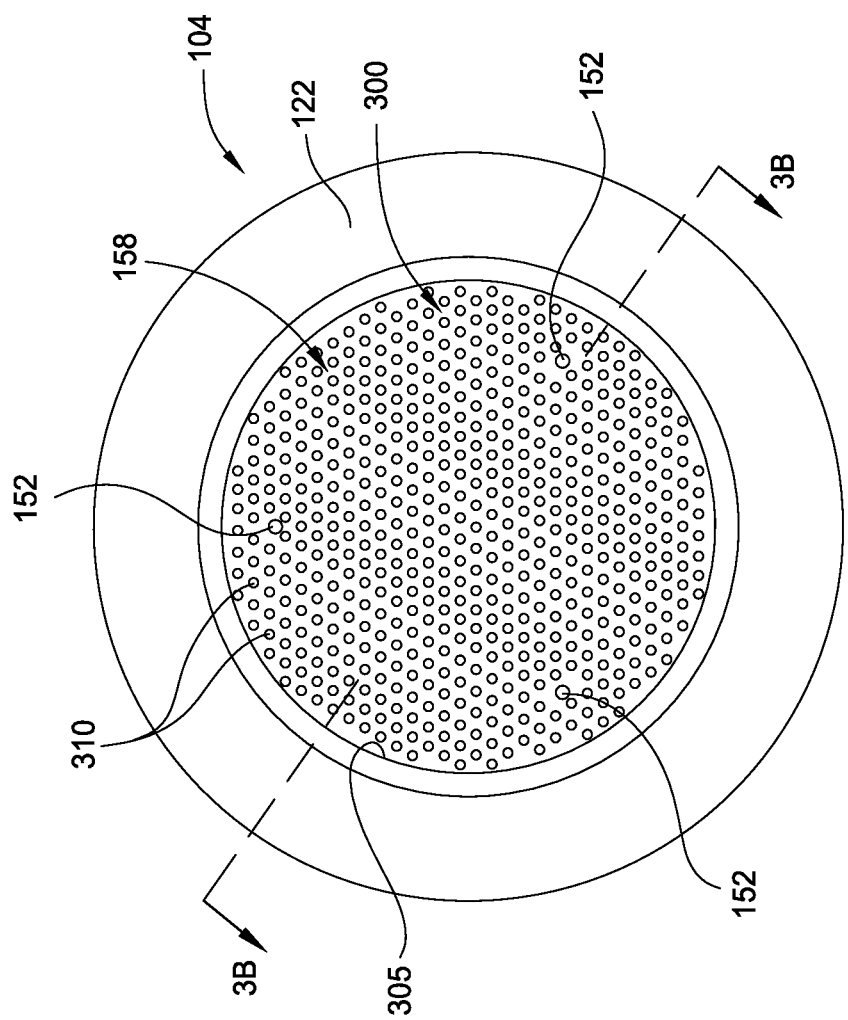
FIG. 3A is a top plan view of the pedestal and one embodiment of an edge ring positioned thereon.

FIG. 3A is a top plan view of the pedestal 104 and one embodiment of an edge ring 158 positioned thereon. FIG. 3B is a sectional view of the pedestal 104 and the edge ring 158 along lines 3B-3B of FIG. 3A. A substrate 140 is positioned relative to the edge ring 158 in FIG. 3B.

The pedestal 104 includes a substrate receiving area 300 defined within an inner diameter surface 305 of the edge ring 158. The substrate receiving area 300 includes three lift pin openings 152 formed through the optically transparent body 122. The lift pin openings 152 are aligned with the substrate support pins 144 shown in FIG. 1 which are configured to pass therethrough when the pedestal 104 is lowered toward the window 114 as described in FIG. 1.

The substrate receiving area 300 also includes a plurality of orifices 310 formed at least partially through the optically transparent body 122 of the pedestal 104. Each of the orifices 310 are in fluid communication with the fluid supply 132 shown in FIG. 1 and configured to flow a fluid stream towards a backside of the substrate 140 (shown in FIG. 3B) in order to lift or "float" the substrate 140 relative to the substrate receiving area 300, rotate the substrate 140 relative to the substrate receiving area 300, and/or move the substrate 140 laterally relative to the substrate receiving area 300.

A greater portion of the orifices 310 are adapted lift the substrate 140 while a lesser portion of the orifices 310 are adapted for rotational movement and/or lateral movement of the substrate 140. In one example, about 90% of the orifices 310 are utilized for lifting the substrate 140 while the remainder of the orifices 310 is utilized for rotational movement and/or lateral movement of the substrate 140.

As shown in FIG. 3B, the substrate 140 is lifted above a perforated surface 315 of the pedestal 104. The perforated surface 315 includes the plurality of orifices 310, which are shown in FIG. 3B as a first set of nozzles 320, a second set of nozzles 325A and 325B, and a third set of nozzles 330A and 330B.

In some embodiments, the optically transparent body 122 of the pedestal 104 is formed from multiple plates that are joined together by a known process. In such an example, the perforated surface 315 is provided in a first plate 335 of the optically transparent body 122.

A first radial channel 340 is formed in a second plate 345 of the optically transparent body 122. The first radial channel 340 is coupled between the first set of nozzles 320 and the fluid supply 132 via the flexible conduits 146 or the conduits 150 provided on or in the lift pins 138 as described in FIG. 1.

A set of second radial channels 350A and 350B is formed in a third plate 360 of the optically transparent body 122. The set of second radial channels 350A and 350B are coupled between the second set of nozzles 325A and 325B, respectively, and the fluid supply 132 via the flexible conduits 146 or the conduits 150 provided on or in the lift pins 138 as described in FIG. 1.

A set of third radial channels 365A and 365B is formed in a fourth plate 370 of the optically transparent body 122. The set of third radial channels 365A and 365B are coupled between the third set of nozzles 330A and 330B, respectively, and the fluid supply 132 via the flexible conduits 146 or the conduits 150 provided on or in the lift pins 138 as described in FIG. 1.

Each of the first set of nozzles 320 are configured to provide a jet of fluid from the fluid supply 132 to lift the substrate 140 away from the perforated surface 315 of the pedestal 104. In one embodiment, each of the first set of nozzles 320 are configured to provide a jet of fluid from the perforated surface 315 of the pedestal 104 in a direction that is substantially parallel to the longitudinal axis 134 (shown in FIG. 1). In other embodiments, each of the first set of nozzles 320 are configured to provide a jet of fluid from the perforated surface 315 of the pedestal 104 in a direction that is substantially normal to the perforated surface 315 of the pedestal 104. Pressure variations in the fluid from the fluid supply 132 may be provided to the first set of nozzles 320 to vary the spacing between a backside 326 of the substrate 140 and the perforated surface 315 of the pedestal 104. In some embodiments, the first set of nozzles 320 may be utilized to facilitate transfer of the substrate 140 by spacing the substrate 140 away from the perforated surface 315 of the pedestal 104 by a distance that would allow a robot blade or end effector to pass therebetween.

Each of the second set of nozzles 325A and 325B are configured to provide a jet of fluid from the fluid supply 132 to rotate the substrate 140 relative to the pedestal 104 and/or a geometric center 327 of the pedestal 104. In some embodiments, each of the second set of nozzles 325A and 325B are configured to provide a jet of fluid in a direction that is substantially normal to the longitudinal axis 134 (shown in FIG. 1) as well as in a direction that is angled relative to a plane of the perforated surface 315 of the pedestal 104. In other embodiments, each of the second set of nozzles 325A and 325B are configured to provide a jet of fluid in a direction that is substantially azimuthally oriented relative to the geometric center 327 of the pedestal 104 as well as in a direction that is angled relative to a plane of the perforated surface 315 of the pedestal 104. The angle relative to the plane of the perforated surface is an acute angle, for example, an angle of about 30 degrees to about 60 degrees, such as an angle of about 45 degrees. Rotational movement is provided by the nozzles 325A being angled and oriented as described above in a clockwise direction and the nozzles 325B in a counter-clockwise direction.

Each of the third set of nozzles 330A and 330B are configured to provide a jet of fluid from the fluid supply 132 to move the substrate 140 laterally relative to the perforated surface 315 of the pedestal 104 and/or the longitudinal axis 134 (shown in FIG. 1). In some embodiments, each of the third set of nozzles 330A and 330B are configured to provide a jet of fluid in a direction that is substantially radially oriented relative to the geometric center 327 of the pedestal 104 as well as in a direction that is angled relative to a plane of the perforated surface 315 of the pedestal 104. The angle relative to the plane of the perforated surface is an acute angle, for example, an angle of about 30 degrees to about 60 degrees, such as an angle of about 45 degrees. Lateral movement is provided by the nozzle 330A being angled and oriented as described above in a radially-inward direction and the nozzles 330B in a radially outward direction.

In the embodiment shown in FIG. 3B, the optically transparent body 122 includes a coating 372 provided on a portion of a backside surface 374 thereof. The coating 372 is utilized to filter light from the lamp assembly 154 (shown in FIG. 1) in certain wavelengths from reaching the temperature sensors 117. The coating 372 may be provided on portions of the optically transparent body 122 that are not aligned with the edge ring 158 and the substrate 140, which would block light emitted from the lamp assembly 154 from reaching the temperature sensors 117. In the embodiment shown, the coating 372 is provided on the backside surface 374 from a perimeter of the optically transparent body 122 to a position radially inward of the inner diameter surface 305 of the edge ring 158 (i.e., regions of the optically transparent body 122 that light from the lamp assembly 154 would pass through to the temperature sensors 117 during processing). Thus, during processing, light from the lamp assembly 154 is prevented from reaching the temperature sensors 117 by the coating 372, the edge ring 158 and the substrate 140. The coating 372 may be an opaque film, such as a tungsten film, a platinum film, or other suitable opaque film. The opaque film may also include a cap layer of silicon dioxide.

FIG. 3C is a schematic plan view of the pedestal 104 and FIG. 3D is an enlarged partial plan view of one embodiment of the perforated surface 315 of the pedestal 104. The first set of nozzles 320 are formed in concentric circles 375. The second set of nozzles 325A and 325B are provided in a first ring 380 that is concentric and between two of the concentric circles 375 of the first set of nozzles 320. The third set of nozzles 330A and 330B are provided in a second ring 385A and a third ring 385B, respectively. Each of the second ring 385A and the third ring 385B is concentric with and between two of the concentric circles 375 of the first set of nozzles 320. As shown in FIG. 3D, the direction of the fluid exiting the second set of nozzles 325A and 325B and the third set of nozzles 330A and 330B is shown by directional arrows.

Embodiments of the pedestal 104 as described herein provide several benefits in a rapid thermal annealing process. One advantage includes uniform heating of a substrate as thermal energy passes through the optically transparent pedestal without any absorption. This prevents thermal gradients as well as providing uniform heating across the surface of the substrate, as hot spots and cool spots that may be present in a conventional susceptor is eliminated. While fluids utilized to lift and/or position the substrate may cause heat loss, the heat loss is compensated as the thermal energy is provided at the same side of the substrate that is impinged by the fluid. When heating is completed, the cool down rate is greater than that of conventional systems as the fluid from the pedestal 104 as described herein removes heat from the substrate by absorption and removal thereof in the fluid.

While the foregoing is directed to embodiments of the present disclosure, other and further embodiments of the disclosure may be devised without departing from the basic scope thereof, and the scope thereof is determined by the claims that follow.

The invention claimed is:

1. A pedestal for a thermal treatment chamber, the pedestal comprising:
a body consisting of an optically transparent material and having a geometric center, wherein the body includes:
a first plate with a perforated surface having a plurality of nozzles formed therein, a first portion of the plurality of nozzles formed in the body at an angle that is orthogonal to a plane of the first plate, a second portion of the plurality of nozzles formed in the body in an azimuthal orientation and at an acute angle relative to the plane of the first plate, and a third portion of the plurality of nozzles formed in the body in a radial orientation and at an acute angle relative to the plane of the first plate, wherein the azimuthal orientation is perpendicular to the radial orientation, and wherein the third portion of the plurality of nozzles includes a first nozzle adapted to flow a fluid radially inward across the perforated surface towards the geometric center and a second nozzle adapted to flow a fluid radially outward across the perforated surface away from the geometric center.

2. The pedestal of claim 1, wherein the body is coupled to a plurality of flexible conduits adapted to couple to a fluid supply.

3. The pedestal of claim 2, wherein each of the plurality of flexible conduits comprise a metal hose.

4. The pedestal of claim 1, wherein the body is coupled to one or more lift pins.

5. The pedestal of claim 4, wherein at least one of the lift pins includes a plurality of conduits formed therein, each of the conduits adapted to couple to a fluid supply.

6. The pedestal of claim 1, wherein the body comprises a second plate coupled to the first plate, the second plate including a first plurality of radially oriented channels that are in fluid communication with a portion of the plurality of nozzles formed in the first plate.

7. The pedestal of claim 1, wherein the plurality of nozzles are formed in concentric circles on the first plate.

8. The pedestal of claim 1, wherein the second portion of the plurality of nozzles includes a first nozzle adapted to flow a fluid in a first direction and a second nozzle adapted to flow a fluid in a second direction that is opposite to the first direction.

9. A pedestal for a thermal treatment chamber, the pedestal comprising:
a body consisting of an optically transparent material and having a geometric center, wherein the body includes:
a first plate with a perforated surface having a plurality of nozzles formed therein, a first portion of the plurality of nozzles formed in the body at an angle that is orthogonal to a plane of the first plate, a second portion of the plurality of nozzles formed in the body in an azimuthal orientation and at an acute angle relative to the plane of the first plate, and a third portion of the plurality of nozzles formed in the body in a radial orientation and at an acute angle relative to the plane of the first plate, wherein the azimuthal orientation is perpendicular to the radial orientation, and wherein the third portion of the plurality of nozzles includes a first nozzle adapted to flow a fluid radially inward across the perforated surface towards the geometric center and a second nozzle adapted to flow a fluid radially outward across the perforated surface away from the geometric center; and a second plate coupled to the first plate, the second plate including a first plurality of radially oriented channels that are in fluid communication with a portion of the plurality of nozzles formed in the first plate.

10. The pedestal of claim 9, wherein the second portion of the plurality of nozzles includes a first nozzle adapted to flow a fluid in a first direction and a second nozzle adapted to flow a fluid in a second direction that is opposite to the first direction.

11. The pedestal of claim 9, wherein the body is coupled to a plurality of flexible conduits adapted to couple to a fluid supply.

12. The pedestal of claim 11, wherein each of the plurality of flexible conduits comprises a metal hose.

13. The pedestal of claim 9, wherein the body is coupled to one or more lift pins.

14. The pedestal of claim 13, wherein at least one of the lift pins includes a plurality of conduits formed therein, each of the conduits adapted to couple to a fluid supply.

15. A pedestal for a thermal treatment chamber, the pedestal comprising:

a body consisting of an optically transparent material and having a geometric center, wherein the body includes:

a first plate with a perforated surface having a plurality of nozzles formed therein in concentric circles, a first portion of the plurality of nozzles formed in the body at an angle that is orthogonal to a plane of the first plate, a second portion of the plurality of nozzles formed in the body in an azimuthal orientation and at an acute angle relative to the plane of the first plate, and a third portion of the plurality of nozzles formed in the body in a radial orientation and at an acute angle relative to the plane of the first plate, wherein the azimuthal orientation is perpendicular to the radial orientation, and wherein the third portion of the plurality of nozzles includes a first nozzle adapted to flow a fluid radially inward across the perforated surface towards the geometric center and a second nozzle adapted to flow a fluid radially outward across the perforated surface away from the geometric center; and a second plate coupled to the first plate, the second plate including a first plurality of radially oriented channels that are in fluid communication with a portion of the plurality of nozzles formed in the first plate.

16. The pedestal of claim 15, wherein the body is coupled to a plurality of metal hoses adapted to couple to a fluid supply.

17. The pedestal of claim 15, wherein the body is coupled to one or more lift pins.

18. The pedestal of claim 17, wherein at least one of the lift pins includes a plurality of conduits formed therein, each of the conduits adapted to couple to a fluid supply.

\* \* \* \* \*